United States Patent [19]
Chou et al.

[11] Patent Number: 5,843,824
[45] Date of Patent: Dec. 1, 1998

[54] DIODE-BASED SEMICONDUCTOR READ-ONLY MEMORY DEVICE AND METHOD OF FABRICATING THE SAME

[75] Inventors: Jih-Wen Chou; Jemmy Wen, both of Hsinchu, Taiwan

[73] Assignee: United Microelectronics Corp., Hsinchu, Taiwan

[21] Appl. No.: 838,152

[22] Filed: Apr. 15, 1997

[30] Foreign Application Priority Data

Feb. 17, 1997 [TW] Taiwan ................................ 86101856

[51] Int. Cl.[6] ............................................. H01L 21/8236
[52] U.S. Cl. ........................ 438/278; 438/130; 438/237; 438/296
[58] Field of Search .................................. 438/130, 237, 438/275, 276, 278, 296

[56] References Cited

U.S. PATENT DOCUMENTS

| | | | |
|---|---|---|---|
| 4,694,566 | 9/1987 | Conner et al. ........................ | 438/130 |
| 5,441,907 | 8/1995 | Sung et al. ........................... | 438/237 |
| 5,470,774 | 11/1995 | Kunitou ............................... | 438/278 |

Primary Examiner—Chandra Chaudhari
Attorney, Agent, or Firm—Finnegan, Henderson, Farabow, Garrett & Dunner, L.L.P.

[57] ABSTRACT

A diode-based ROM device and a method for fabricating the same are provided. The ROM device is of the type including an array of diode-based memory cells for permanent storage of binary-coded data therein. In the semiconductor structure of the ROM device, a plurality of insulator-filled trenches are formed for isolation of the diode-based memory cells. This feature allows the prevention of the punch-through effect when the ROM device is downsized. Further, the bit lines for the ROM device are formed with an increased junction depth such that the resistance of the bit lines can be reduced to allow an increase in the magnitude of the currents in the bit lines for easier detection and distinguishing of the binary state the currents represent. In accordance with the method, the mask-programming process can be easily implemented by forming contact windows at predetermined locations that are associated with the memory cells that are to be set to a permanently-ON state, and then doping an impurity material through the contact windows into an upper portion of the associated bit lines to form a junction diode thereon. The memory cells that are not formed with diodes are set to a permanently-OFF state.

12 Claims, 4 Drawing Sheets

DIODE-BASED SEMICONDUCTOR READ-ONLY MEMORY DEVICE AND METHOD OF FABRICATING THE SAME

BACKGROUND OF THE INVENTION

1. Field of the Invention

This invention relates to semiconductor memory devices, and more particularly, to a semiconductor read-only memory (ROM) device of the type including an array of diode-based memory cells for permanent storage of binary-coded data.

2. Description of Related Art

Read-only memory (ROM) is a nonvolatile semiconductor memory widely used in computer and microprocessor systems for permanently storing information including programs and data that are repeatedly used, such as the BIOS (abbreviation for Basic Input/Output System, a widely used operating system on personal computers) or the like. The manufacture of ROMs involves very complicated and time-consuming processes and requires costly equipment and material to achieve. Therefore, the data to be permanently stored in ROMs is usually first defined by the customer and then furnished to the factory to be programmed into the ROMs.

Most ROMs are identical in semiconductor structure except for the different data stored therein. Therefore, the ROM devices can be fabricated up to the stage ready for data programming and then the semi-finished products are stocked in inventory awaiting customer orders. The customer then furnishes the data to the factory where the data are stored into the semi-finished ROMs by using the so-called mask-programming process. This procedure is now a standard method in the semiconductor industry for fabricating ROMs.

In most conventional ROMs, metal-oxide semiconductor field-effect transistors (MOSFET) are used as the memory cells for the data storage. In the mask-programming process stage, impurities are doped into selected channel regions so as to provide the associated memory cells with different threshold voltage levels representing the storage of different values of the binary-coded data. Whether one MOSFET-based memory cell is set to store a binary digit of 0 or 1 depends on whether the associated channel region is doped with impurities or not. If one channel region is doped with impurities, the associated MOSFET-based memory cell is set to a low threshold voltage, effectively setting the MOSFET-based memory cell to a permanently-ON state representing the storage of a first binary digit, for example 0; otherwise, the MOSFET-based memory cell is set to a high threshold voltage, effectively setting the MOSFET-based memory cell to a permanently-OFF state representing the storage of a second binary digit, for example 1.

One conventional MOSFET-based ROM device is shown in FIGS. 1A through 1C, in which FIG. 1A is a schematic top view of the ROM device; FIG. 1B is a cross-sectional view of the ROM device of FIG. 1 cutting through the line 1B—1B; and FIG. 1C is a cross-sectional view of the ROM device of FIG. 1 cutting through the line 1C—1C.

As shown, the conventional MOSFET-based ROM device includes a semiconductor substrate, such as a P-type silicon substrate, on which a plurality of parallel-spaced bit lines 11 and a plurality of parallel-spaced word lines 13 intercrossing the bit lines 11 are formed. The word lines 13 are isolated from the underlying bit lines by an oxidation layer 12. This ROM device includes an array of MOSFET-based memory cells, each being associated with one segment of the word lines 13 between each neighboring pair of the bit lines 11.

Referring to FIG. 1C, in the method for fabricating the foregoing ROM device, the first step is to conduct an ion-implantation process so as to dope an N-type impurity material, such as arsenic (As), into selected regions of the substrate 10 to form a plurality of parallel-spaced diffusion regions serving as the bit lines 11. The interval region between each neighboring pair of the bit lines 11 serves as a channel region 16. Subsequently, a thermal oxidation process is performed on the wafer so as to form the oxidation layer 12 over the entire top surface of the wafer. Next, a conductive layer, such as a highly-doped polysilicon layer is formed over the wafer, and then selectively removed through a photolithographic and etching process. The remaining portions of the conductive layer serve as the word lines 13. This completes the fabrication of a semi-finished product of the ROM device awaiting for customer order.

In the mask-programming process, a mask layer 15 is first formed over the wafer. This mask layer 15 is predefined to form a plurality of contact windows according to the bit pattern of the binary-coded data that are to be programmed into the ROM device for permanent storage. These contact windows expose those channel regions that are associated with a selected group of the MOSFET-based memory cells of the ROM device that are to be set to a permanently-ON state. The covered MOSFET-based memory cells are to be set to a permanently-OFF state. Subsequently, an ion-implantation process is performed on the wafer so as to dope a P-type impurity material, such as boron (B), through the contact windows in the mask layer 15 into the exposed channel regions. This completes the so-called code implantation process.

In the finished product of the ROM device, the doped channel regions cause the associated MOSFET-based memory cells to be set to a low threshold voltage, effectively setting those MOSFET-based memory cells to a permanently-ON state representing the permanent storage of a first binary digit, for example 0. On the other hand, the undoped channel regions cause the associated MOSFET-based memory cells to be set to a high threshold voltage, effectively setting those MOSFET-based memory cells to a permanently-OFF state representing the permanent storage of a second binary digit, for example 1.

One drawback to the foregoing MOSFET-based ROM device is that it involves quite a complex process to fabricate. Moreover, when it is desired to further downsize the semiconductor structure of the MOSFET-based memory cells for increased integration, the adverse effect of punch-through will occur, thus precluding the downsizing. Still moreover, since the N$^+$ diffusion regions, which serve as bit lines, have a fixed cross-sectional resistance of about 100 Ω/ (ohm per square) and are formed with a small cross section based on the conventional structure, the resistances of the bit lines are high. This causes the current from the bit lines during access operation to be small. In making a ROM device, it is usually desirable to have the current from the bit lines to be large during access operation such that the current can be easily detected.

SUMMARY OF THE INVENTION

It is therefore a primary objective of the present invention to provide a diode-based ROM device which allows for an increased junction depth for the buried bit lines such that the resistance of the bit lines can be lowered to increase the current in the bit lines.

It is another objective of the present invention to provide a diode-based ROM device in which the punch-through effect can be prevented when the ROM device is downsized.

It is still another objective of the present invention to provide a method for fabricating a diode-based ROM device, which allows for easy implementation of the mask-programming process.

In accordance with the foregoing and other objectives of the present invention, a new diode-based ROM device and a method for fabricating the same are provided.

The method in accordance with the invention for fabricating a diode-based ROM device includes the following steps of:

(1) preparing a semiconductor substrate of a first semiconductor type, and then forming a plurality of substantially parallel-spaced trenches in a surface of the substrate in a first direction;

(2) forming a first insulating layer over the substrate, the first insulating layer filling up all of the trenches in the substrate;

(3) removing a thickness of the first insulating layer other than the portions in the trenches;

(4) performing a first ion-implantation process so as to dope a first impurity material of a second semiconductor type into those portions of the substrate that are located between the trenches to form a plurality of substantially parallel-spaced first diffusion regions of the second semiconductor type between the trenches, the first diffusion regions serving as a plurality of bit lines for the ROM device on which a plurality of memory cells are defined;

(5) forming a second insulating layer which covers all of the first diffusion regions and all of the remaining portions of the first insulating layer in the trenches;

(6) forming a plurality of contact windows in the second insulating layer so as to expose a selected group of the first diffusion regions that are associated with a first selected group of the memory cells of the ROM device that are to be set to a permanently-ON state;

(7) by using the second insulating layer as a mask, performing a second ion-implantation process so as to dope a second impurity material of the first semiconductor type into an upper portion of each of the exposed first diffusion regions so as to form a plurality of second diffusion regions of the first semiconductor type respectively in the upper portion of each of the exposed first diffusion regions; each of the second diffusion regions and the associated one of the first diffusion regions in combination constituting a junction diode;

(8) forming a conductive layer over the second insulating layer, which fills up all of the contact windows in the second insulating layer to form electrical contacts to all of the second diffusion regions; and (9) removing selected portions of the conductive layer so as to form a plurality of substantially parallel-spaced word lines in a second direction.

The semiconductor structure of the ROM device in accordance with the invention includes the following elements:

(a) a semiconductor substrate of a first semiconductor type formed with a plurality of substantially parallel-spaced trenches therein in a first direction;

(b) a plurality of first insulating layers each filling up one of the trenches in the substrate;

(c) a plurality of substantially parallel-spaced first diffusion regions of a second semiconductor type formed in the solid portions of the substrate between the trenches, the first diffusion regions serving as a plurality of bit lines for the ROM device on which a plurality of memory cells are defined;

(d) a plurality of second diffusion regions of the first semiconductor type each being formed in an upper portion of each of a selected group of the first diffusion regions that are associated with a selected group of the memory cells of the ROM device that are to be set to a permanently-ON state; each of the second diffusion regions and the associated one of the first diffusion regions in combination constituting a junction diode on which one memory cell that is set to a permanently-ON state is based;

(e) a second insulating layer formed with a plurality of contact windows therein at predetermined locations corresponding to the first selected group of the memory cells of the ROM device that are set to a permanently-ON state, with the other memory cells that are covered by the second insulating layer being set to a permanently-OFF state; and (f) a plurality of substantially parallel-spaced conductive layers over the second insulating layer, the conductive layers serving as a plurality of word lines coming into electrical contact via the contact windows in the second insulating layer with all of the second diffusion regions.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

FIGS. 2A through 2F are schematic sectional diagrams used to depict the steps involved in the method of the invention for fabricating a preferred embodiment of the diode-based ROM device of the invention.

Figure 1A:
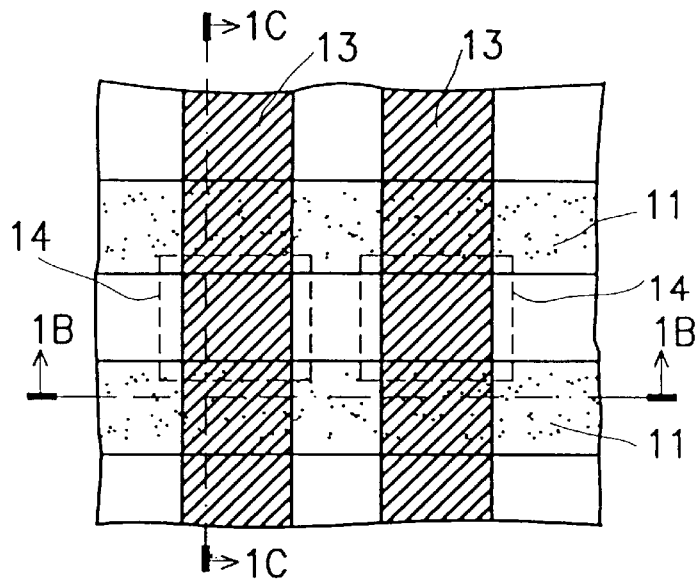
FIG. 1A is a schematic top view of a conventional MOSFET-based ROM device.
Figure 1B:
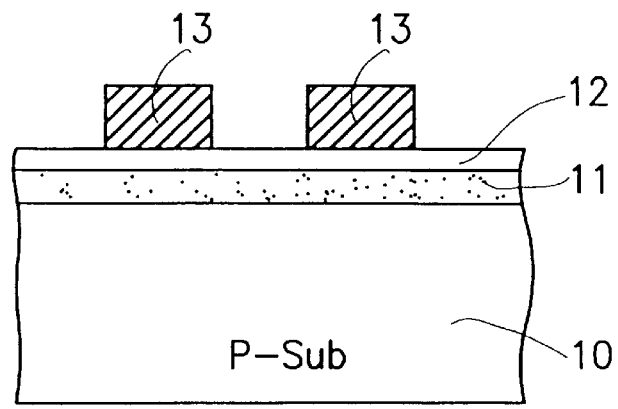
FIG. 1B is a schematic sectional view of the conventional MOSFET-based ROM device of FIG. 1A.
Figure 1C:
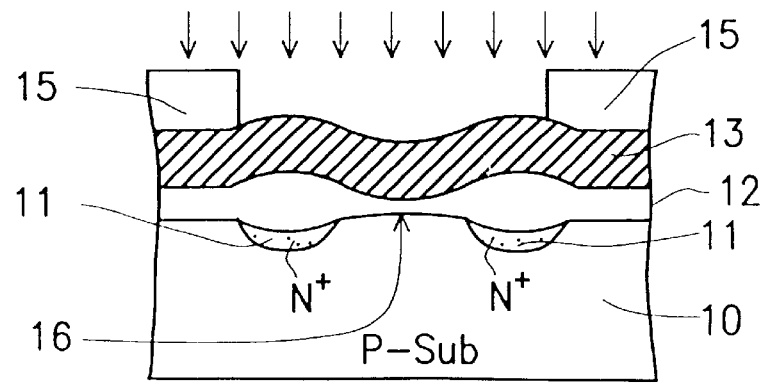
FIG. 1C is another schematic sectional view of the conventional MOSFET-based ROM device of FIG. 1A.
Figure 2A:
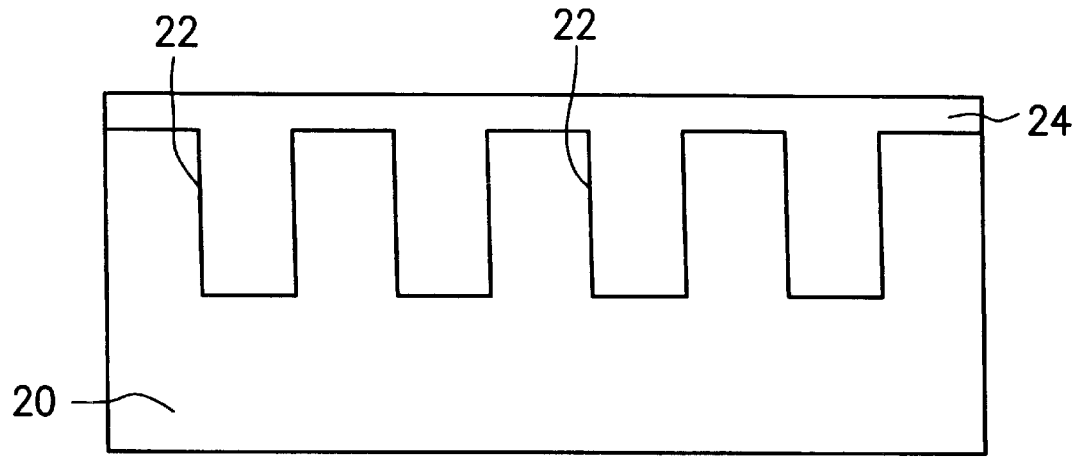
FIGS. 2A through 2F are schematic sectional diagrams used to depict the steps involved in the method of the invention for fabricating a diode-based ROM device.

Referring first to FIG. 2A, in the first step, a semiconductor wafer of a first semiconductor type, such as a P-type silicon substrate 20, is prepared. Next, a photoresist layer (not shown) is coated over the wafer and then selectively removed by a photolithographic and etching process so as to expose those surface areas on the substrate 20 where a plurality of trenches are to be formed. Then, by using the photoresist layer (not shown) as a mask, a dry etching process, such as an reactive ion etching (RIE) process, is performed on the wafer so as to remove the exposed portions of the substrate 20, whereby a plurality of substantially parallel and equally spaced trenches 22 are formed.

Subsequently, a first insulating layer 24 is formed over the entire top surface of the wafer, which also fills up all of the trenches 22 in the substrate 20. The first insulating layer 24 can be, for example, a layer of silicon dioxide formed by chemical-vapor deposition (CVD).

Figure 2B:
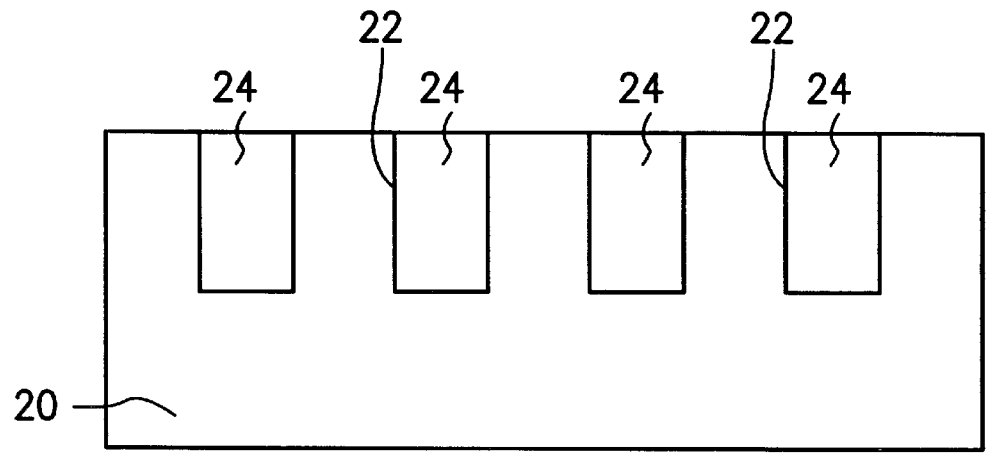

Referring next to FIG. 2B, a thickness of the insulating layer 24 that is layered above the topmost surface of the substrate 20 is entirely removed, either through an anisotropic etch-back process or through a chemical-mechanical polish (CMP) process, until the topmost surfaces of the substrate 20 between the trenches 22 are exposed. Through this process, those portions of the insulating layer 24 that fill up the trenches 22 are not removed.

Figure 2C:
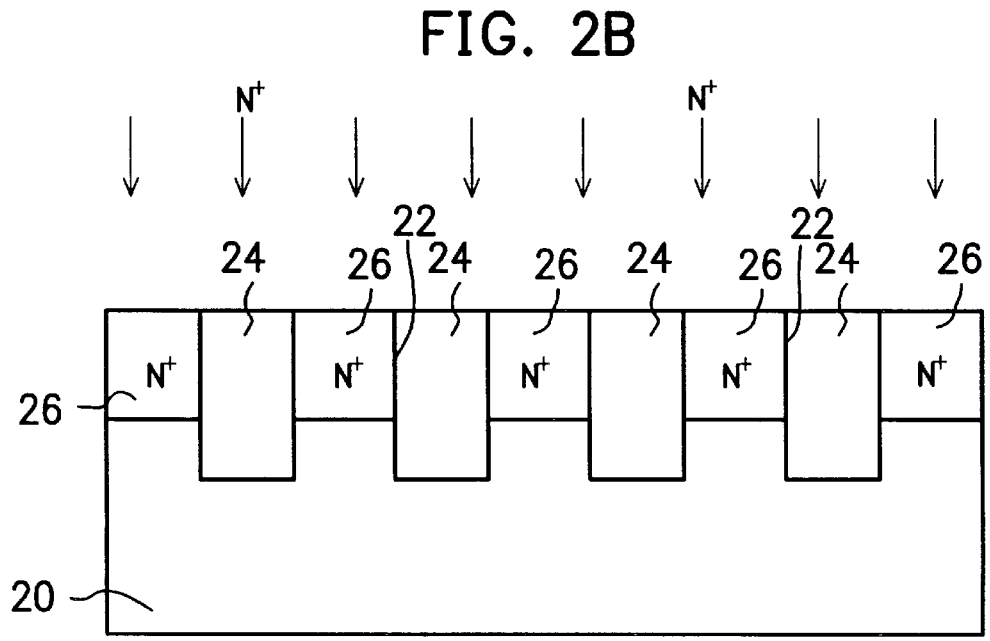

Referring further to FIG. 2C, in the subsequent step, an ion-implantation process is performed on the wafer so as to dope an impurity material of a second semiconductor type, for example N-type arsenic (As) or phosphorus (P), into those portions of the substrate 20 that are located between the trenches 22. As a result of this, a plurality of $N^+$ diffusion regions 26 are formed. These $N^+$ diffusion regions 26 are to be used to serve as a plurality of bit lines for the ROM device. The length resistance of the $N^+$ diffusion regions 26 is decreased as the depth thereof into the substrate 20 is increased. However, to avoid short-circuits between the resultant bit lines, the bottommost end of the $N^+$ diffusion regions 26 should not exceed the bottommost end of the trenches 22 (in other words, the bottommost end of the $N^+$ diffusion regions 26 should be formed between the topmost and bottommost end of the trenches 22).

Figure 2D:
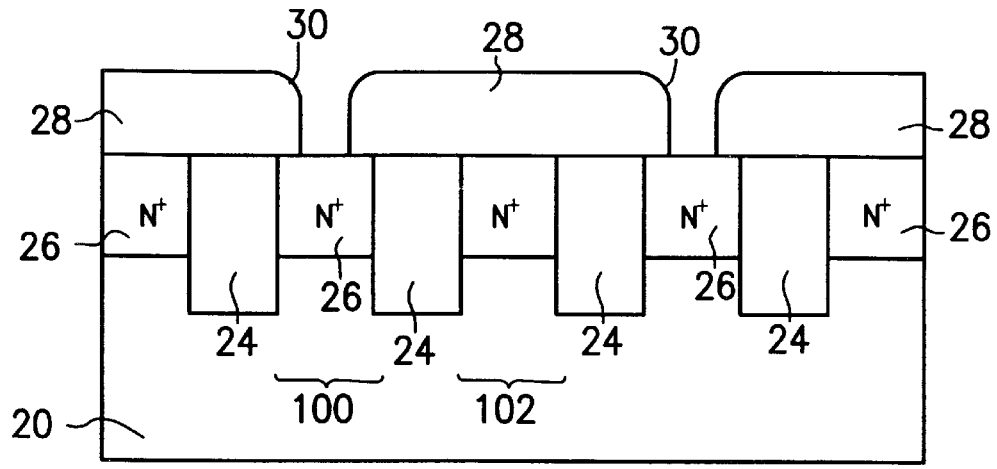

Referring next to FIG. 2D, the subsequent step is to perform a mask-programming process for permanent storage of binary-coded data into the memory cells the ROM device. First, a second insulating layer 28 is formed over the entire top surface of the wafer. The second insulating layer 28 can be, for example, a layer of silicon dioxide or silicon nitride formed by the CVD process. Then, the second insulating layer 28 is selectively removed to form a plurality of contact windows 30 which expose a selected group of the $N^+$ diffusion regions 26 that are associated with a first selected group of the memory cells of the ROM device that are to be set to a permanently-ON state. The unexposed group of the $N^+$ diffusion regions 26 are associated with a second selected group of the memory cells of the ROM device that are to be set to a permanently-OFF state.

In the case of FIG. 2D, for example, the memory cell that is designated by the reference numeral 100 is to be set to a permanently-ON state representing the permanent storage of a first binary digit, for example 1, since there is one contact window 30 formed thereon to expose the associated $N^+$ diffusion regions.

On the other hand, the memory cell that is designated by the reference numeral 102 is to be set to a permanently-OFF state representing the permanent storage of a second binary digit, for example 0, since no contact window is formed thereon to expose the associated $N^+$ diffusion regions.

Figure 2E:
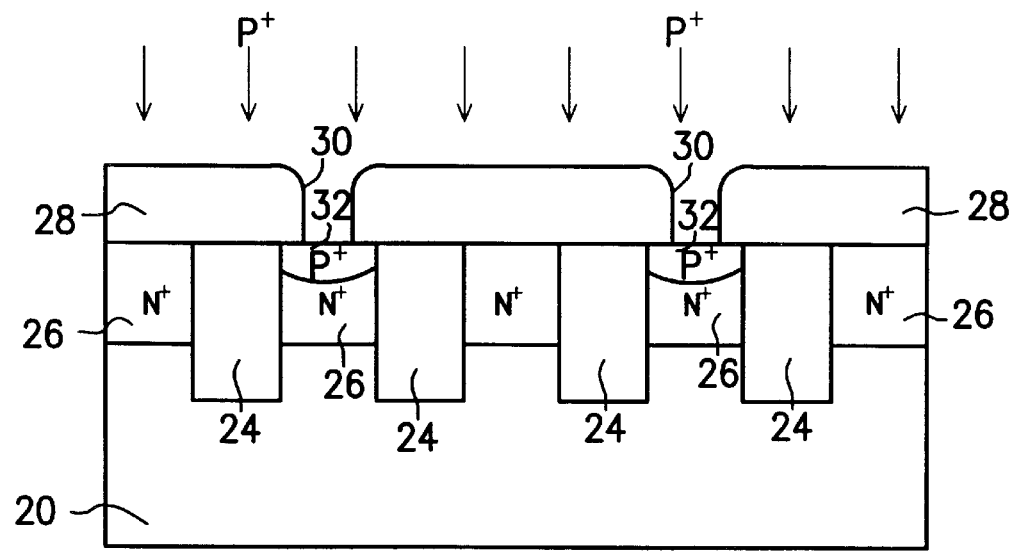

Referring next to FIG. 2E, in the subsequent step, the second insulating layer 28 is used as a mask to conduct an ion-implantation process on the wafer so as to dope an impurity material of the first semiconductor type, for example P-type boron (B), into an upper portion of each of the exposed group of the $N^+$ diffusion regions 26. As a result of this, a plurality of $P^+$ diffusion regions 32 are formed respectively in the upper portion of each of the exposed group of the $N^+$ diffusion regions 26. Each of the $P^+$ diffusion regions 32 and the associated one of the $N^+$ diffusion regions 26 in combination constitute a P-N junction diode which is associated with one memory cell of the ROM device that is to be set to a permanently-ON state.

Figure 2F:
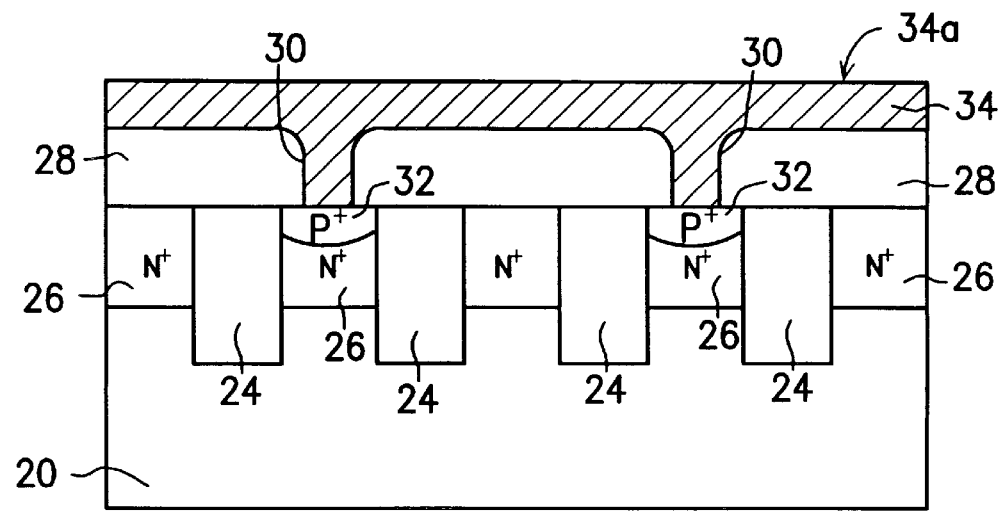

Referring further to FIG. 2F, in the subsequent step, a conductive layer 34 is formed over the entire top surface of the second insulating layer 28, which also fills up all of the contact windows in the second insulating layer 28. The conductive layer 34 can be, for example, a layer of highly-doped polysilicon, or alternatively a metallization layer of tungsten, titanium, or aluminum. Next, the conductive layer 34 is selectively removed so as to form a plurality of substantially parallel and equally spaced word lines 34a intercrossing the $N^+$ diffusion regions 26 (bit lines). This completes the mask-programming process for the diode-based ROM device. The following steps for finishing the product of the ROM device are all conventional processes so the description thereof will not be further detailed.

In the foregoing preferred embodiment, the first semiconductor type is P-type while the second semiconductor type is N-type; i.e., the substrate 20 is P-type, the diffusion regions 26 are N-type and the overlaying diffusion regions 32 are P-type. Alternatively, the first semiconductor type can be N-type while the second semiconductor type is P-type; i.e., the substrate 20 is N-type, while a P-type impurity material is used instead of N-type in the ion-implantation process for forming the diffusion regions 26 and an N-type impurity material is used instead of P-type in the ion-implantation process for forming the diffusion region 32.

Figure 3:
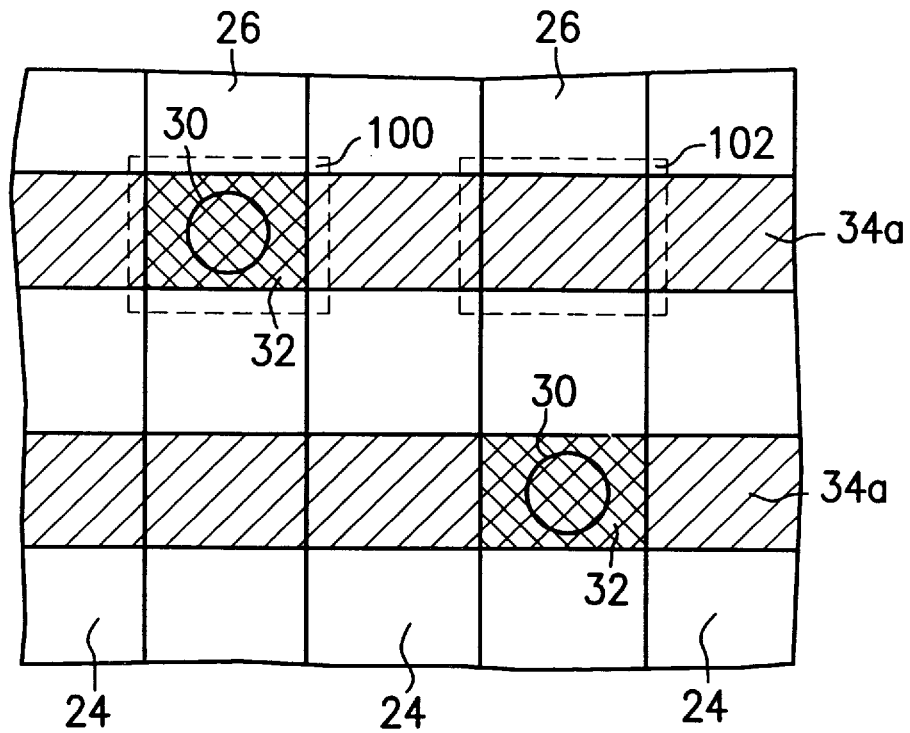
FIG. 3 is a schematic top view of the finished product of the diode-based ROM device of the invention.

FIG. 3 shows a schematic top view of the finished product of the diode-based ROM device of the invention. As shown, each of the intersections between the $N^+$ diffusion regions (bit lines) 26 and the conductive layers (word lines) 34a is one of the locations where the memory cells of the ROM device are formed. In the mask-programming process, if a particular memory cell, for example as the one designated by the reference numeral 100, is to be set to a permanently-ON state, one contact window 30 is formed in the second insulating layer 28 (FIG. 2F), as designated by a solid circle in FIG. 3, at the location of the intersection where the memory cell is formed. Otherwise, no contact window is formed, as for example with the memory cell designated by the reference numeral 102 that is to be set to a permanently-OFF state.

Figure 4:
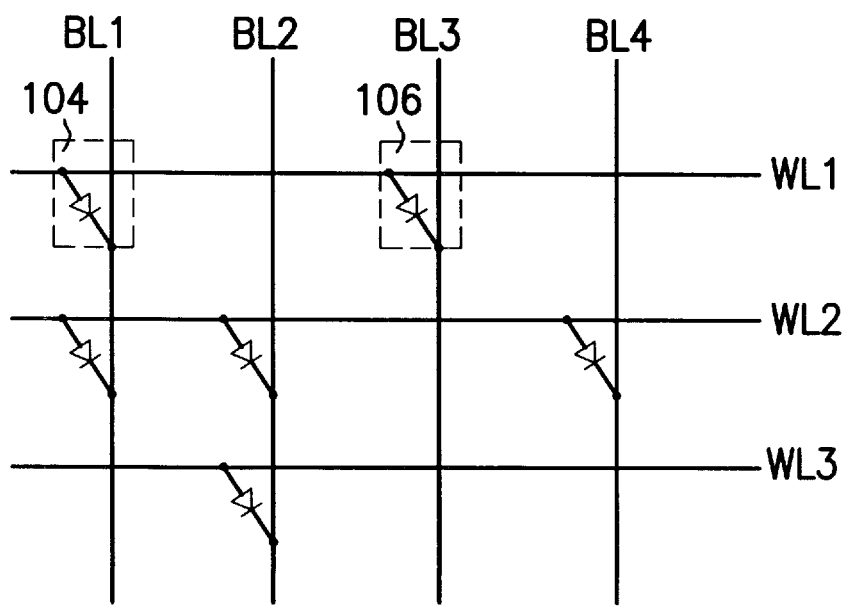
FIG. 4 shows an equivalent circuit diagram of the diode-based ROM device of the invention.

FIG. 4 shows an equivalent circuit diagram of the diode-based ROM device of the invention. This diagram shows that the ROM device can be accessed via a plurality of word lines WL1, WL2, WL3, and a plurality of bit lines BL1, BL2. In this circuit diagram, the memory cells that are set to a permanently-ON state are each labeled with a diode symbol, as for example the two memory cells designated by the reference numerals 104, 106; while the memory cells that are set to a permanently-OFF state are labeled with no diode symbol. To gain access to the data stored in the memory cells on the word line WL1, for example, a positive potential of abut 1 to 5 V (volt) is applied to the word line WL1. Since the memory cells 104, 106 are formed with diodes, a current can be detected in the associated bit lines, i.e., BL1 and BL3, indicating that the two associated memory cells are set to a permanently-ON state. On the other hand, no current will be detected in the bit lines BL2 and BL4, indicating that the two associated memory cells are set to a permanently-OFF state. This access operation is a conventional technique so the description thereof will not be further detailed.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a diode-based ROM device, comprising the steps of:

(1) preparing a semiconductor substrate of a first semiconductor type, and then forming a plurality of substantially parallel-spaced trenches on a surface of the substrate in a first direction;

(2) forming a first insulating layer over the substrate, the first insulating layer filling up all of the trenches on the substrate;

(3) removing a thickness of the first insulating layer other than the portions in the trenches;

(4) performing a first ion-implantation process so as to dope a first impurity material of a second semiconductor type into those portions of the substrate that are located between the trenches to form a plurality of substantially parallel-spaced first diffusion regions of the second semiconductor type between the trenches, the first diffusion regions serving as a plurality of bit lines for the ROM device on which a plurality of memory cells are defined;

(5) forming a second insulating layer which covers all of the first diffusion regions and all of the remaining portions of the first insulating layer in the trenches;

(6) forming a plurality of contact windows in the second insulating layer so as to expose a selected group of the first diffusion regions that are associated with a first selected group of the memory cells of the ROM device that are to be set to a permanently-ON state;

(7) by using the second insulating layer as a mask, performing a second ion-implantation process so as to dope a second impurity material of the first semiconductor type into an upper portion of each of the exposed first diffusion regions so as to form a plurality of second diffusion regions of the first semiconductor type respectively in the upper portion of each of the exposed first diffusion regions;

each of the second diffusion regions and the associated one of the first diffusion regions in combination constituting a junction diode;

(8) forming a conductive layer over the second insulating layer, which fills up all of the contact windows in the second insulating layer to come in electrical contact with all of the second diffusion regions; and (9) removing selected portions of the conductive layer so as to form a plurality of substantially parallel-spaced word lines in a second direction.

2. The method of claim 1, wherein the first semiconductor type is P-type while the second semiconductor type is N-type.

3. The method of claim 1, wherein the first semiconductor type is N-type while the second semiconductor type is P-type.

4. The method of claim 1, wherein in said step (2), the first insulating layer is a layer of silicon dioxide.

5. The method of claim 1, wherein in said step (3), the thickness of the first insulating layer is removed by performing a CMP process.

6. The method of claim 1, wherein in said step (3), the thickness of the first insulating layer is removed by performing an anisotropic etching-back process.

7. The method of claim 1, wherein in said step (4), the first diffusion regions are each formed by doping to a depth less than the depth of the trenches in the substrate.

8. The method of claim 1, wherein in said step (5), the second insulating layer is a layer of silicon dioxide.

9. The method of claim 1, wherein in said step (5), the second insulating layer is a layer of silicon nitride.

10. The method of claim 1, wherein in said step (8), the conductive layer is a layer of highly-doped polysilicon.

11. The method of claim 1, wherein in said step (8), the conductive layer is a metallization layer.

12. The method of claim 1, wherein in said step (9), the second direction is oriented substantially at a right angle with respect to the first direction.

* * * * *